United States Patent [19]

de Sartre

[11] Patent Number: 4,645,945
[45] Date of Patent: Feb. 24, 1987

[54] SWITCHING CONTROL CIRCUIT FOR A POWER TRANSISTOR

[75] Inventor: Jean de Sartre, Meylan, France
[73] Assignee: Thomson-CSF, Paris, France
[21] Appl. No.: 711,762
[22] Filed: Mar. 14, 1985
[30] Foreign Application Priority Data
Mar. 16, 1984 [FR] France ................. 84 04112
[51] Int. Cl.⁴ .................. H03K 17/60; H03K 3/26; H03K 3/33
[52] U.S. Cl. .................. 307/254; 307/270; 307/297; 307/300
[58] Field of Search ............. 307/254, 270, 300, 297

[56] References Cited

U.S. PATENT DOCUMENTS

| | | | |
|---|---|---|---|
| 4,213,068 | 7/1980 | Ahmed | 307/300 |
| 4,215,279 | 7/1980 | Lataire et al. | 307/270 |
| 4,323,825 | 4/1982 | Hayes | |
| 4,549,095 | 10/1985 | Stefani et al. | 307/300 |

FOREIGN PATENT DOCUMENTS 3230236 7/1982 Fed. Rep. of Germany .

OTHER PUBLICATIONS

IBM Technical Disclosure Bulletin, vol. 17, No. 4, Sep. 1974, pp. 1091-1092, New York, US; K. H. Knickmeyer: "Dynamic Transistor Antisaturation Control'-'—p. 1091, alinea 2—p. 1092.

Primary Examiner—Stanley D. Miller
Assistant Examiner—B. P. Davis
Attorney, Agent, or Firm—Cushman, Darby & Cushman

[57] ABSTRACT

A switching control circuit for power transistors controlling an inductive load. To avoid oversaturation of the transistor, causing excessive consumption and a switching difficulty on opening, said transistor is caused to operate at the limit of saturation, by means of an emitter resistor, a quasi current mirror in parallel across said resistor, another current mirror and a current amplifier. The current from said first current mirror is controlled on or off by a square wave generator such as those used in chopped power supplies or television scanning circuits for which the invention is particularly appropriate.

2 Claims, 3 Drawing Figures

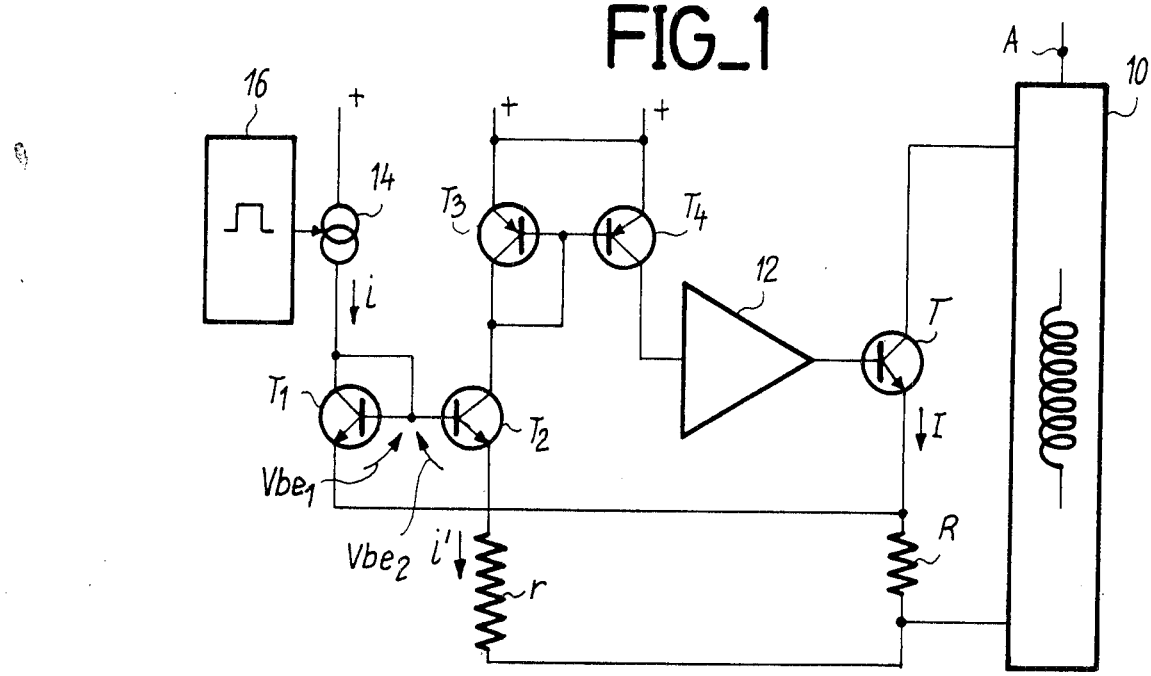
FIG_1
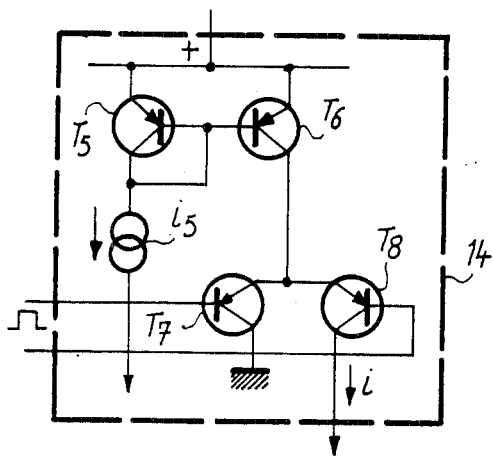
FIG_2
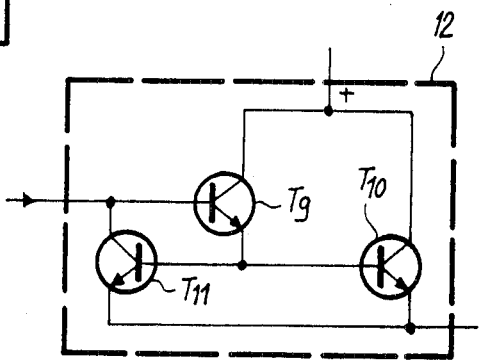
FIG_3

SWITCHING CONTROL CIRCUIT FOR A POWER TRANSISTOR

BACKGROUND OF THE INVENTION

1. Field of the Invention

The present invention relates to circuits for switching relatively high currents and voltages and more particularly those used for switching currents in an essentially inductive load.

The invention concerns more particularly switching control circuits for chopped power supplies and circuits for controlling the horizontal or vertical scan in television receivers.

2. Description of the Prior Art

In these circuits, the switching element is a power transistor whose collector is connected to a highly inductive load comprising essentially transformer windings (for chopped power supplies) or a coil for horizontal or vertical deflection of the electronic beam (for scanning circuits).

Very often, the base of the power transistor is controlled by a circuit providing periodic control square waves of variable width.

At the high level of the square waves, a base current is applied for enabling the transistor; at the low level, this current is interrupted so as to disable the transistor.

The transistor must be able to conduct a considerable current which moreover increases linearly from a minimum value to a maximum value, at each switching period, when the load is inductive. So that the transistor may conduct the maximum current expected at the end of the conduction period (maximum deflection current for the electronic beam in the case of scanning in a television receiver), it is necessary to apply a largely sufficient current at the base of this transistor during the conduction period.

When a square wave is applied with such a largely calculated base current, the result is heavy saturation of the transistor, which adversely affects its turn-off speed at the end of the conduction period: the heavily saturated transistor will not be able to rapidly interrupt the current which flows therethrough, despite the interruption of a current applied to its base.

It is moreover now general to accelerate disabling of the transistor by applying a high negative base current pulse slightly after interruption of the square wave which controls the application of a positive base current.

Furthermore, apart from the moment when the transistor is disabled, the square wave controlling conduction of the usual devices establishes a positive base current (for maintaining conduction) which, during the whole period of desired conduction, keeps a constant value at least equal to the maximum current required at the end of the conduction period; such a high base current is not at all necessary at the beginning of conduction and it leads to a quite useless waste of power.

The present invention provides a circuit which avoids this heavy saturation and useless consumption of base current, since at all times it adjusts the base current as well as possible by giving it the required value with respect to the main current which is to flow through the power transistor at that time.

SUMMARY OF THE INVENTION

The circuit of the invention, for controlling the switching of a power transistor in series with an essentially inductive load, comprises a generator generating square waves of variable width, a first low value resistor, a second resistor of a much higher value, two transistor assemblies forming essentially current mirrors each comprising a first transistor connected as a diode and a second copying transistor, the two transistors, of the same NPN or PNP type in the same assembly and of a type opposite those of the other assembly, having their bases joined together, the first resistor being connected on the one hand to the emitter of the power transistor and on the other to the second resistor which is further connected to the emitter of the copying transistor of the first current mirror; the first transistor of the first current mirror has its emitter connected to the emitter of the powertransistor and has its collector in series with a current source controlled to be on or off by the square wave generator; the collector of the copying transistor of the first current mirror is connected to the collector of the first transistor of the second current mirror; the emitters of the first and second transistors of the second current mirror are joined together but not those of the first mirror, and the collector of the second current mirror is connected to an input of a current amplifier whose output is connected to the base of the power transistor.

The detailed operation of this circuit will be explained further on but it may be mentioned now that only the second current mirror is a true current mirror (transistors having their bases joined together and their emitters joined together). The first one acts as a current mirror only at the beginning of the conduction period of the power transistor; the emitters of the transistors of this mirror are moreover not connected together.

Essentially, the circuit operates as follows: at the beginning of a square wave for enabling the power transistor, generated by the generator of square waves of variable width, a small current is established in the first current mirror. This current is amplified by the current amplifier which then begins to cause the power transistor to conduct. The growth of the current in this transistor is then dictated by the inductive character of the load, and this growth induces in the low value resistor a voltage drop which is reflected in the high value resistor and which in its turn induces a growth of the current at the input of the current amplifier controlling the power transistor. The growth of the current controlling this latter therefore follows exactly the requirements dictated by the increasing current consumption in the inductive load. There is neither oversaturation of the power transistor nor excessive base current consumption during the conduction period.

BRIEF DESCRIPTION OF THE DRAWINGS

Other features and advantages of the invention will be clear from the following detailed description with reference to the accompanying drawings in which:

FIG. 1 is a control circuit diagram in accordance with the invention,

FIG. 2 shows in detail one embodiment of the controlled current source of FIG. 1, and FIG. 3 shows in detail one embodiment of the current amplifier of FIG. 1.

DESCRIPTION OF THE PREFERRED EMBODIMENTS

The circuit of the invention comprises (FIG. 1) a power transistor T for switching a current in an essentially inductive load which has been shown in the form of a block connected on the one hand to the collector of transistor T and on the other through a low value resistor R to its emitter, and finally a bias voltage source (terminal A) supplying the power required for feeding the load 10. In what follows it will be assumed that transistor T is of NPN type. Otherwise the polarities must be reversed.

By way of example, block 10 comprises simply the primary of a transformer, for a chopped power supply, this primary being in series between the collector of transistor T and the positive power supply terminal A, resistor R being connected to a negative power supply terminal. For a television scanning circuit, block 10 may further comprise a deflecting coil essentially in parallel with the primary of the transformer (which is then the so called line transformer). It will be noted that resistor R may be the series resistor often used at this position as current detector for supplying a current overshoot signal to a circuit protecting transistor T.

The base of transistor T is controlled by a current amplifier 12 supplying an output current essentially proportional to its input current.

A first assembly of two NPN transistors T1 and T2 with their bases connected together forms what will be called in the rest of the description and in the claims a "current mirror", and a second assembly of two PNP transistors T3, and T4 with their bases connected together forms a second current mirror. In fact, only the second assembly forms a true current mirror such that the current flowing through transistor T3 is copied by transistor T4 with a factor of proportionality dependent solely on the emitter surface ratio of transistor T3 and T4. Assembly T1, T2 resembles a current mirror without quite being one.

Transistors T3 and T4 have their emitters connected together and to a common positive power supply source which may moreover be terminal A. Transistor T3 is connected as a diode, that is to say that its collector and its base are joined together. The collector of transistor T4 (output of the second current mirror) is connected to the input of the current amplifier 12.

The collector of transistor T3 is connected to the output of the first current mirror, i.e. to the collector of transistor T2.

The emitter of transistor T2 is connected to a resistor r of a value much higher than resistor R (for example r is of the order of 100 times R).

The other end of resistor r is connected to resistor R (on the side where it is connected to load 10 so on the side where it is not connected to the emitter of transistor T).

Transistor T1 is connected as a diode (collector connected to its base) and its collector is connected to a current source 14, controlled on or off by a generator 16 generating square waves of variable width, currently used in circuits controlling the switching of chopped power supplies.

The current source 14 is further connected to a positive power supply terminal which may be terminal A. The negative power supply terminal may be connected either to junction point between resistors R and r, or to the emitter of transistor T.

The circuit operates as follows: the power transistor is disabled during phase 1 of a square wave supplied by generator 16 (for example a low level square wave) and it conducts during phase 2 (high level square wave).

Let i be the current from source 14, $Vbe_1$ the base-emitter voltage of transistor T1, $Vbe_2$ that of transistor T2, i' the current through resistor r and I the current in the emitter of transistor T.

The current in transistor T1 is either zero (control square wave at low level) and we then have $Vbe_1=0$, i.e. equal to the nominal value i (square wave at high level) and $Vbe_1$ is then fixed by i.

We may write:

$$Vbe_2 = Vbe_1 + R.(I+i) - ri' \qquad (1)$$

so $$Vbe_2 = Vbe_1 + Ri + RI - ri' \qquad (2)$$

The first two terms are constants when the square wave is at the high level. The second expresses a voltage drop difference in resistors R and r.

If a current increase dI occurs because of the inductive character of the load, the result will be an increase $dVbe_2$ from $Vbe_2$ and consequently an increase di' of the current i'; $Vbe_1$ and i do not change.

We then have:

$$(Vbe_2 + dVbe_2) = Vbe_1 + Ri + R(I+dI) - (i'+di') \qquad (3)$$

From equations (2) and (3) is deduced:

$$dVbe_2 = RdI - rdi' \qquad (4)$$

In fact, $Vbe_2$ varies very little and we can in practice write:

$$RdI = rdi' \qquad (5)$$

But, the increase dI is related to di' by the loop gain resulting from the gain of the second current mirror (which is a true current mirror), from the gain of the current amplifier 12 and from the current gain (emitter current/base current) of transistor T itself. If K is the total gain of the loop, we have:

$$dI = Kdi' \qquad (6)$$

It follows from (5) and (6) that:

$$K = r/R \qquad (7)$$

In fact, the gain K may be broken down into $K = k_1 k_2 k_3$, the product of three gains which are respectively the gain $k_1$ of the second current mirror T3, T4; the gain $k_2$ of amplifier 12 and the current gain $k_3$ of the transistor T itself.

$k_1$ and $k_2$ are constants for the current mirror T3, T4 and amplifier 12 operate under linear conditions.

On the other hand, $k_3$ is not constant: under saturated conditions $k_3$ is equal to 1 (dynamic gain); under linear conditions $k_3$ may be equal to a few tens of units. For quasisaturation, i.e. close to saturation, $k_3$ varies greatly from one to a few units.

It is advantageous for transistor T to operate in this quasisaturation zone so as to avoid excessive base current consumption and a switching difficulty on opening.

So the gains $k_1 k_2$ and the ratio of resistors R and r are chosen so that, because of relationship (7), $k_3$ assumes a forced value corresponding to quasisaturation of the switching transistor. Thus, it is certain that a positive increase of $Vbe_2$ will be provided for a positive increase of current I. Transistor T will remain permanently at the limit of saturation and the current consumed by the base will be minimum.

The currents i and and i' do not need to be high so that transistors T1, T2, T3 may remain of a small size. T4 may be larger so as to participate in obtaining the gain K.

One embodiment of the controlled current source 14 is shown in FIG. 2. It comprises a current source established conventionally by a two transistor current mirror T5, T6 supplied from a positive power supply terminal, transistor T6 copying a known DC current $i_5$ flowing through transistor T5. The collector of transistor T6 is connected directly to the emitters of two transistors T7 and T8 one of which has its collector connected to an electric ground (negative terminal of the power supply) and the other supplies at its connector the current i of FIG. 1.

The output signal of the square wave generator 16 is applied differentially between the bases of transistors T7 and T8 for interrupting or allowing passage of current i.

FIG. 3 shows one possible embodiment of the current amplifier 12 of FIG. 1. It comprises an NPN darlington stage T9, T10 (input at the base of T9, output from the emitter of T10), with an additional amplifying transistor T11 whose base and emitter are connected respectively to the base and the emitter of transistor T10 and whose collector is connected to the base of transistor T9. The collectors of transistors T9 and T10 are connected to a positive power supply terminal.

What is claimed is:

1. A switching control circuit for a power transistor having an emitter, a base, and a collector, said power transistor being in series with an essentially inductive load, comprising:
    a generator for generating square waves of variable width;
    a first resistor having a first value,
    a second resistor having a higher value than that of said first resistor,
    first and second current mirror circuits, each circuit comprising a first transistor connected as a diode said first transistor having an emitter, a base and a collector and a second copying transistor having an emitter, a base and a collector, the two transistors being of the same NPN or PNP type in the same current mirror circuit and of a type opposite those of the other current mirror circuit, the base of said first transistor being coupled to the base of said second transistors,
    said first resistor being connected between the emitter of the power transistor and said second resistor which is connected to the emitter of the copying transistor of the first current mirror circuit; the first transistor of the first current mirror circuit having its emitter connected to the emitter of the power transistor and having its collector in series with a current source controlled on or off by said square wave generator; the copying transistor of said first current mirror circuit having its collector connected to the collector of the first transistor of said second current mirror circuit; the emitters of said first and second transistors of said second current mirror circuit being connected together and the emitter of said first transistor of the first mirror being disconnected from the emitter of the second transistor of the first mirror circuit, and the collector of the second transistor of said second current mirror being connected to an input of a current amplifier whose output is connected to the base of the power transistor.

2. The control circuit as claimed in claim 1, wherein the product of the current gain of the second current mirror circuit multiplied by the current gain of the amplifier is related to the ratio r/R of the second resistor to the first aresistor by the following relationship:

$$r/R = k_1 \, k_2 \, k_3$$

where $k_3$ is a gain value of the power transistor which corresponds to a quasisaturation condition of this transistor.

* * * * *